United States Patent [19]

Bloothoofd

[11] Patent Number: 4,638,758

[45] Date of Patent: Jan. 27, 1987

[54] CAPPED PRINTING PLATE MAKING MACHINE

[75] Inventor: William Bloothoofd, Wilmington, Del.

[73] Assignee: Hercules Incorporated, Wilmington, Del.

[21] Appl. No.: 702,014

[22] Filed: Feb. 15, 1985

[51] Int. Cl.$^4$ .............................................. B05C 5/02
[52] U.S. Cl. .................... 118/412; 118/413; 118/415; 156/501; 222/556; 264/171; 264/216; 355/85; 355/100; 430/935
[58] Field of Search .................. 355/85, 100; 156/501, 156/244.11; 118/411, 412, 413, 415; 430/935; 425/90, 99; 264/171, 212, 216; 222/506, 164, 166, 556

[56] References Cited

U.S. PATENT DOCUMENTS

| | | | |
|---|---|---|---|
| 195,809 | 10/1877 | Durbin | 222/506 |
| 1,746,776 | 2/1930 | Jones et al. | 222/506 |
| 3,072,295 | 1/1963 | Lovette | 222/506 |
| 3,414,173 | 12/1968 | Sackett, Sr. | 222/506 |
| 3,901,419 | 8/1975 | Szendroi | 222/506 |
| 4,056,423 | 11/1977 | Hughes | 156/356 |
| 4,087,182 | 5/1978 | Aiba et al. | 355/85 |
| 4,226,007 | 5/1981 | Hughes et al. | 430/306 |
| 4,332,873 | 6/1982 | Hughes et al. | 430/15 |
| 4,383,759 | 5/1983 | Bloothoofd et al. | 355/85 |
| 4,450,226 | 5/1984 | Bloothoofd | 118/411 |
| 4,545,446 | 10/1985 | Kokabu | 222/556 |

Primary Examiner—Jay H. Woo
Assistant Examiner—James C. Housel
Attorney, Agent, or Firm—Connolly and Hutz

[57] ABSTRACT

A capped printing plate making machine is used for making flexographic capped printing plates. The machine includes a pair of troughs for applying two layers of photopolymerizable resin materials simultaneously. The troughs are so designed that actuation of one trough to permit its material to be applied automatically results in the other trough being positioned and opened for the application of its material.

14 Claims, 12 Drawing Figures

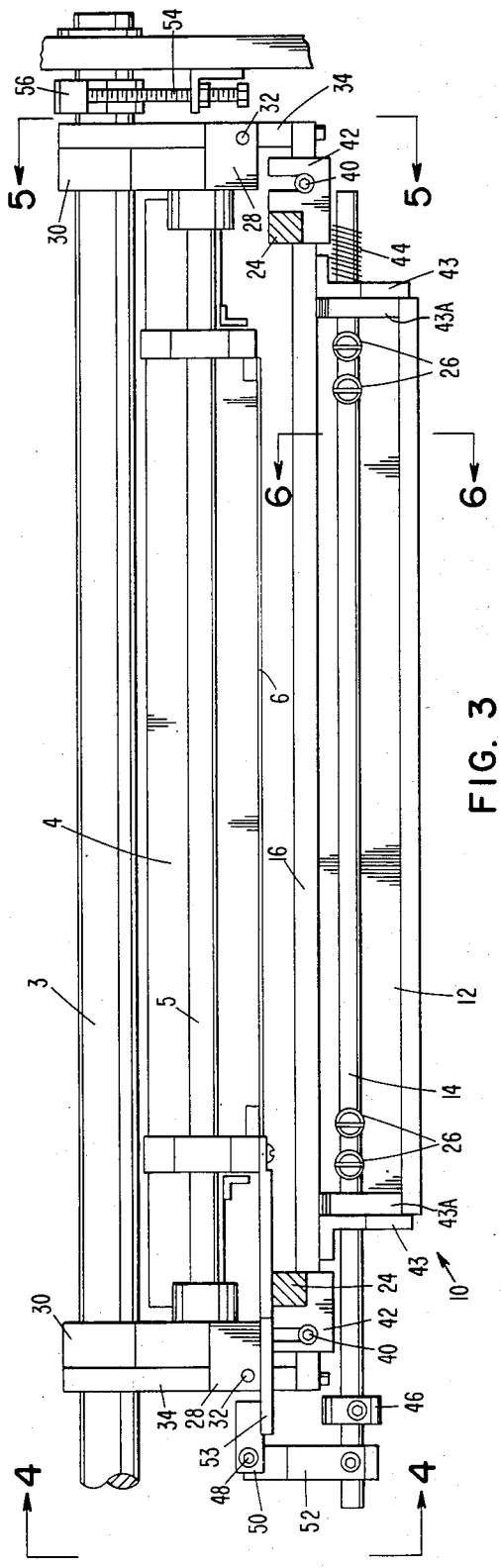
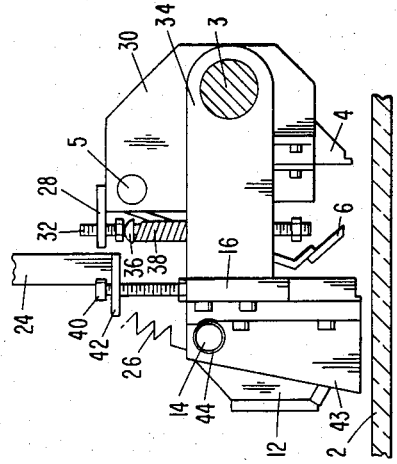
FIG. 5
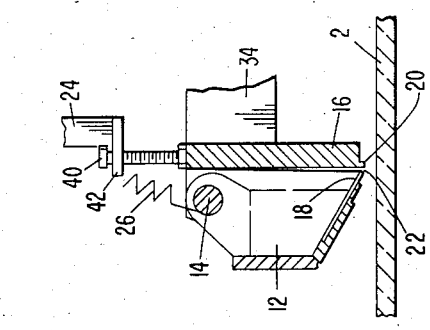
FIG. 3
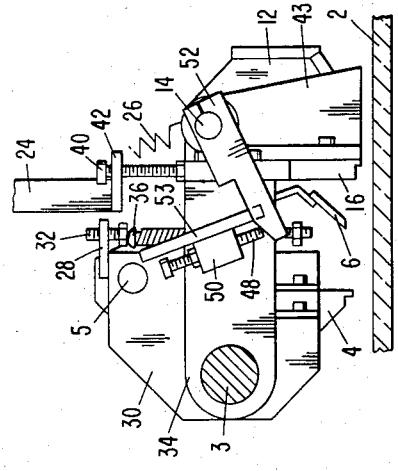
FIG. 6
FIG. 4

CAPPED PRINTING PLATE MAKING MACHINE

BACKGROUND OF THE INVENTION

Traditionally plates for printing presses were produced by hand or were set with movable type. Improvements have led to the use of automatic machines such as linotypes. A particularly effective commercial machine for automatically applying the liquid photopolymerizable resin is marketed by Hercules, Inc. under the designation SRA. In one form of the SRA machine a trough is provided in the form of an elongated tilt bucket which pours the resin material onto a moving sheet after the bucket is tilted. A disadvantage with this form of machine, however, is that it incorporates only a single trough and thus can provide only a single layer of resin. It is desirable in many applications to provide plural layers of resin to the plate. This process is known as "capping". A variation of the SRA machine includes a mainfold in addition to the trough for applying a second layer of resin. The manifold is electrically operated to apply its resin at the desired time. This leads to an increased complexity and cost for such variation.

Reference is made to U.S. Pat. Nos. 4,266,007, 4,332,873 and 4,383,759 which relate to the production of a capped printing plates. Reference is also made to U.S. Pat. No. 4,056,423 relating to platemaking. It would be desirable if a plate making machine were provided combining the advantages of the capping process in a fully automated machine such as the SRA machine.

SUMMARY OF THE INVENTION

An object of this invention is to provide a fully automated plate making machine capable of producing a capped printing plate.

A further object of this invention is to provide such a machine wherein actuation of one trough results in the positioning and opening of the other trough for applying the two resins.

A still further object of this invention is to provide such a machine which may be adapted to existing commercial machines capable of applying a resin and handling the plate in a fully automated manner.

A still further object of this invention is to provide a method of producing capped printing plates.

In accordance with this invention, an automated plate printing machine includes a first trough for applying a layer of liquid photopolymerizable resin to a plate. A second trough is also provided in the machine for applying a layer of resin. The second trough is interrelated with the first trough in such a manner that actuation of the first trough automatically results in actuation of the second trough at the proper time sequence whereby both resins are simultaneously applied in the intended manner.

In a preferred form of this invention the first trough is of the tilt type, and its mounting mechanism includes actuating members which engage complementary members on the mounting mechanism for the second trough whereby during the tilting action of the first trough the second trough is automatically positioned and opened. The second trough is preferably in the form of a bottom opening bucket. Rotation of the first trough during its tilting action causes an abutment member on the rotating mount of the first trough to press against a pin on the mount for the second trough thereby causing the second trough to rotate. During the rotation action of the second trough, the bottom of the second trough is automatically opened to the desired amount for applying its resin.

THE DRAWINGS

FIG. 3 is a top plan view of the machine shown in FIGS. 1–2;

FIG. 4 is a cross-sectional view taken through FIG. 3 along the line 4—4;

FIGS. 5–6 are cross-sectional views taken through FIG. 3 along the lines 5—5 and 6—6, respectively.

DETAILED DESCRIPTION

Figure 1:
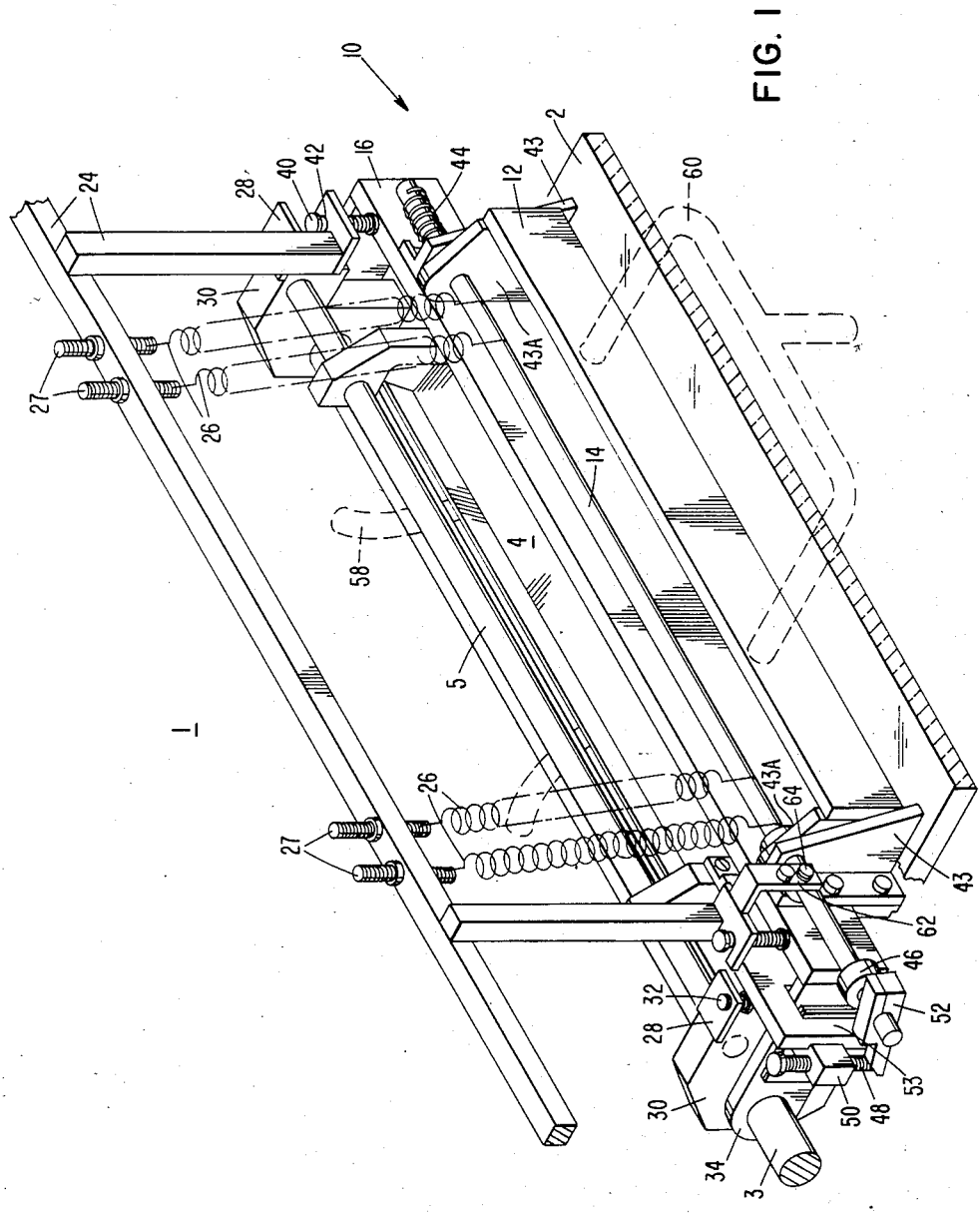
FIG. 1 is a perspective view of a capped printing plate making machine in accordance with this invention.
Figure 2:
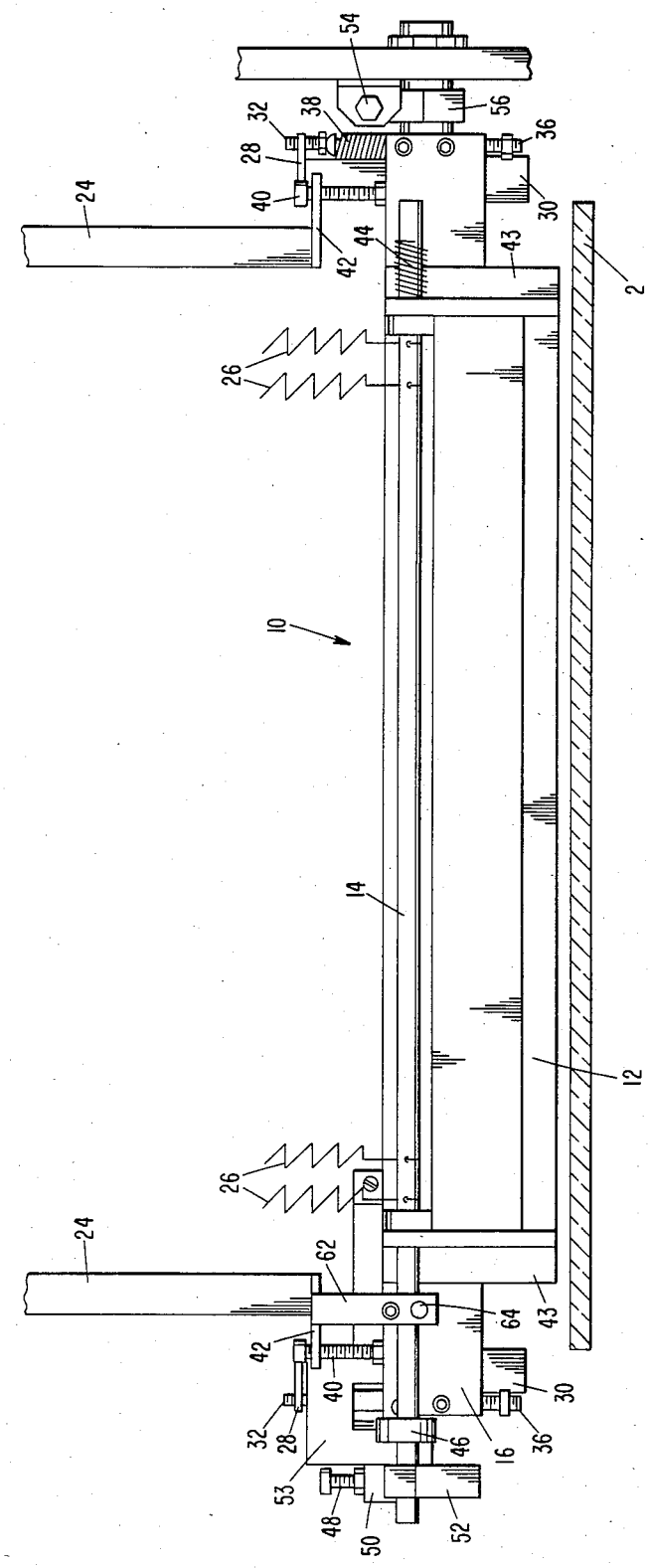
FIG. 2 is a front elevation view of the machine shown in FIG. 1.

The present invention is directed to producing a capped printing plate wherein two layers of liquid photopolymerizable resins are applied to a moving support member for making the printing plate. The layers may or may not be of the same resin. The capped printing process is particularly desirable since it permits the formation of a composite of photopolymerizable materials to be applied which takes advantage of different desired characteristics of those materials. For example, it may be desirable to provide a hard layer which contacts the cover film or protective sheet of the plate composite. It is also desirable, however, to provide a layer of a softer material which would contact the substrate so that the combination of both materials has the advantages of resiliency from the soft layer and hard printing from the other layer. In the making of printing plates it is also desirable to control the thickness of the material being applied since different raised image thicknesses are frequently preferred for different printing operations. Where the capped printing process is used a further consideration is the coordination of the two applicating steps so that the proper thickness of each layer is applied and the materials are also applied in the proper time sequence and location. Additionally the layers must be applied with minimal intermixing.

There are presently in existence various automatic plate making machines which provide the necessary controls to assure that the photopolymerizable material is properly applied. One such machine is commercially marketed with the designation SRA. The drawings and description herein make specific reference to such a machine. It is to be understood, however, that the concepts of this invention are not intended to be limited to any particular machine. Rather the invention may be practiced with other types of plate making machines. Some of the specific details regarding the operation of the invention, however, are such that the present invention is particularly suited for utilizing the SRA machine to a machine for producing a capped printing plate while still maintaining the automatic operation thereof. As will be appreciated, the invention is particularly noteworthy since it permits such conversion to a capped printing process with minimal modifications to the existing machine.

In the use of such SRA machine the resin applicating unit is stationary and the sheets on which the resins are applied move under the applicating unit. In the applicating section of the machine a protective sheet made from polypropylene or any other suitable plastic material passes under the resin applicating unit. A first layer of resin would be applied directly to the cover sheet and a second layer would be applied directly on the first layer. Next a substrate made from, for example, Mylar (registered trademark of the DuPont Company for plastic film) would be placed in contact with the second layer. The composite would then be moved to the exposure section of the machine with the substrate still at the top of the plate composite and the cover sheet or film being on the bottom to protect the negative on the bottom glass of the machine. In this section of the machine the plate composite is disposed between two banks of lights. Each layer of the plate composite is transparent or translucent. The lights shining from above and below cause the resin layers to stick to the substrate and to harden. It is to be understood that the invention may be practiced with other machines where, for example, the layers are applied directly on the substrate itself.

Figure 4A:
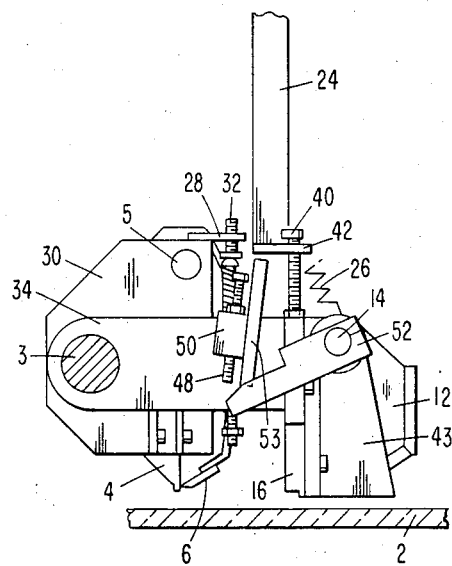
FIG. 4A is a view similar to FIG. 4 in a different phase of operation.

FIG. 1 illustrates the details of the invention as used with a known SRA machine 1. Since the details of the machine itself are known in the art, a detailed description thereof is not necessary. Instead features of the known machine will be referred to solely where necessary to understand the operation of the invention. In general machine 1 includes an upstream or resin applicating section in which the printing plate is formed. In practice the protective sheet is fed over a base member 2 forming part of machine 1. Machine 1 also includes a movable drip pan (not shown) on base 2. Machine 1 includes a shaft 3 upon which is mounted a trough 4. In the known machine, trough 4 is of the tilt bucket type wherein resin material in the trough 4 is poured onto the protective sheet by rotation of the shaft 3. This movement of trough 4 from its inactive position to its applicating position is accomplished by circuitry and mechanical mechanisms including cams which are part of the equipment in the commercial machine. Machine 1 also includes a shaft 5 parallel to trough shaft 3. A scoop 6 is mounted on shaft 5. Scoop 6 is in the form of a pivotable plate having a knive edge. Initially (FIGS. 4A and 7A) scoop 6 is closed. Scoop 6 is later opened to permit the resin to be applied by trough 4. At the end of this applicating step, scoop 6 is again closed and sweeps in trough 4 to pick up resin. Trough 4 is also provided with a doctor blade to control the thickness of the resin being applied. The knife edge of scoop 6 is positioned to drop below the trough doctor blade.

The details described to this point regarding machine 1 refer to features in the known machine. FIG. 1 illustrates the device 10 for converting machine 1 to a capped printing plate machine by automatically applying an additional layer of resin to the plate without the use of a manifold as in one form of the known machine. In the preferred embodiment described herein, the additional resin layer is applied from second trough 12. Trough 12 is upstream from first trough 4. Accordingly trough 12 would apply a first layer directly on the protective sheet and trough 4 would apply a second layer directly on the first layer.

In accordance with the invention, the mounting unit or mechanism for trough 4 includes actuating means whereby during the movement of trough 4 from its inactive position to its applicating position, the actuating means interacts with complementary actuating means on the mounting unit or mechanism for trough 12 in such a way to automatically move trough 12 from its inactive position to its applicating position and then permit trough 12 to return to its inactive position after its resin applications has been completed.

In general the application of the resins to the support takes place by the sequence of steps involving first moving scoop 6 to its open position followed by the tilting or rotation of trough 4 from its inactive position through the known actuating mechanisms of the commercial machines. During the movement of trough 4 the next step would be to actuate trough 12 so that it begins to move out of its inactive position. This is accomplished, as later described, by rotating trough 12 downwardly about shaft 3 by means of mounting arms 34, as later described. The rotation of trough 12 continues until trough 12 reaches a predetermined position. Trough 12 is, in the preferred form, of the bottom opening type having a fixed back wall 16 (FIG. 6) and a flexible lip 18 which forms its bottom wall. During the rotation of trough 12 lip 18 remains in contact and in sealing engagement with back plate 16. Lip 18 terminates in a knife edge of about 3 mil thickness. The knife edge of lip 18 presses flat against plate 16 to provide a particularly effective seal. The knife edge seal of lip 18 thus eliminates any air bubbles in the resin. This is particularly important in forming thin plates. As later described, the movement of scoop 6 from its closed to its open position causes lip 18 to move away from back plate 16 so that the resin in trough 12 may be applied at the proper time to the protective sheet passing beneath trough 12.

As resin is continuously supplied from trough 12 onto the protective sheet, the sheet passes beneath trough 4 and its resin is simultaneously applied on top of the first layer of resin. When the applicating operation has been completed, scoop 6 is actuated to pick up the excess resin from trough 4, which causes scoop actuator 53, block 50 and pin 48 to move away from lever 52, allowing shaft 14 to rotate back to its closed position, thereby moving lip 18 against back plate 16. This action of lip 18 scoops up all the excess resin of trough 12. Troughs 4 and 12 then reverse their direction and move back toward their original inactive position. Lip 18 may be considered a flexible lip in that it is made of a material such as a steel shim stock which can buckle to give lip 18 its flexibility. A doctor blade 20 extends downwardly from back plate 16 to control the thickness of the resin layer. Advantageously lip 18 drops below the level of doctor blade 20 when trough 12 is open so that lip 18 can scoop up any excess resin from trough 12. During the return movement of trough 4 and after the closing of the applicating opening 22 between lip 18 and back plate 16, trough 12 is also returned to its original inactive position.

As shown in FIG. 1 device 10 includes an upstanding frame 24 to which are mounted sets of spring members 26, 26. The opposite ends of springs 26 are secured to shaft 14 to urge the shaft into a direction away from its applicating position. It is to be understood that the illustration of four springs 26 is for exemplary purposes and any number of springs can be used as well as alternative means for urging trough 12 away from its applicating position. For example, instead of the illustrated springs, a leaf spring could be utilized for the same purposes.

As shown in FIG. 1 the mounting mechanism for trough 4 includes a pair of plates 28 mounted to plates 30 to which trough 4 is secured. Thus plates 28 move concurrently with trough 4. Each plate 28 is provided with an abutment member 32 in the preferred form of this invention. Abutment members 32 are threadably secured to plates 28 so that the effective length of each abutment member 32 can be conveniently adjusted to assure proper timing in the actuation of trough 12. It is similarly noted that springs 26 are also adjustably mounted by means of threaded members 27 to permit regulation of the proper force applied by springs 26.

The mount unit for trough 12 includes a pair of arms 34 fixedly secured to back plate 16 of trough 12 at each end thereof and arms 34 are rotatably mounted on main shaft 3. A pressure pin 36 extends through each arm 34. A spring 38 reacts between the head of pressure pin 36 and its respective arm 34. Pressure pin 36 is located in the path of movement of abutment member 32. Accordingly during the tilting action of trough 4 about shaft 3, abutment members 32 contact the respective pressure pins 36 to urge the pins downwardly. Under the action of springs 38 arms 34 are also moved downwardly about shaft 3, and in turn cause trough 12 to rotate downwardly toward its applicating position (FIG. 7D).

A pair of stop members 40 are provided on back plate 16 of trough 12. Frame 24 includes a pair of brackets providing arcuate seats or surfaces 42 disposed in the path of movement of stop members 40. Thus rotation of trough 12 is permitted under the action of abutment members 32 pressing against pressure pins 36 until stop members 40 seat against surfaces 42. This occurs when trough 12 is in its proper orientation or applicating position for applying its resin to the protective sheet as shown in FIGS. 6 and 7D. At this point in the sequence of operations trough 4 has still not rotated a sufficient amount to pour its contents on the protective sheet. Similarly bottom opening trough 12 is still closed because lip 18 is still in contact with back plate 16. Continued rotation of trough 4 causes abutment members 32 to further press against pressure pins 36. Because trough 12 can no longer rotate by virtue of stop members 40 contacting stop seats or surfaces 42, springs 38 around pressure pins 36 are compressed, and pressure pins 36 move downwardly through arms 34 as shown in FIG. 7D.

Trough 12 is rotatably mounted on shaft 14 by end walls 43A which, in turn, are connected to bottom wall or lip 18. (As shown in FIG. 1, plates 43 adjacent end walls 43A support shaft 14 and are bolted to back wall 16.) Springs 44 on shaft 14 urge end walls 43A in a direction whereby lip 18 is maintained in sealing contact with back wall 16 to keep trough 12 closed. As illustrated, one of the springs (omitted for clarity) is located in collar 46 to permit adjustability of the spring force. A collar may be provided for each spring or if desired the collar may be completely omitted. Similarly by selecting an appropriate spring, only one spring might be necessary.

The mounting unit for trough 4 also includes a lever actuating member 48. In the preferred form of the invention member 48 is threadably secured to block 50 to provide adjustability of its effective length. Block 50, in turn, is connected to scoop actuator 53 which is connected to scoop 6. Thus the movement of scoop 6 to and from its open and closed positions is transmitted to lever actuating member 48 through block 50 and scoop actuator 53. Lip 18 is secured to a lever 52 secured to shaft 14 and located in the path of movement of actuator 48. Accordingly rotation of scoop 6 to its open position causes actuating member 48 to contact lever 52 causing shaft 14 to rotate by overcoming the force of springs 44 and move lip 18 away from back plate 16 thereby creating the applicating opening 22. The various elements such as abutment members 32, stops 40 and lever actuator 48 are adjusted so that opening 22 is created at precisely the proper time with respect to trough 4 being in its application position to assure that trough 12 applies its layer to the protective sheet essentially simultaneously with the resin application by trough 4 and that the applicating steps of both troughs thereafter simultaneously occur. Rotation of trough 4 to its applicating position continues until its stop member 54 contacts its stop surface 56 (FIG. 3) as in the known machine.

After the resin has been applied, and as previously discussed, scoop 6 is actuated and trough 4 is then rotated in a reverse direction back to its original inactive position. The reverse movement of scoop 6 back to its closed position not only results in scoop 6 picking up resin, but also (because of its connection to actuator 48) causes lever actuator 48 to come out of contact with lever 52 thereby permitting lip 18 to return into sealing contact with back plate 16 while simultaneously scooping excess resin. Accordingly both troughs are simultaneously closed. Rotation of trough 4 in its return direction causes abutment members 32 to move away from pressure pins 36 whereby trough 12 then returns to its original position with stop members 40 moving out of seats 42. Thus both troughs are also simultaneously returned to their rest positions. Both troughs 4 and 12 remain in their inactive or rest positions until the time for the next operation. A new supply of resin is fed through tubes 58 leading to trough 4 and tubes 60 leading to trough 12. Resin would be fed to the trough to a level above their feed tubes to avoid air mixing with the resin.

Figure 7A:
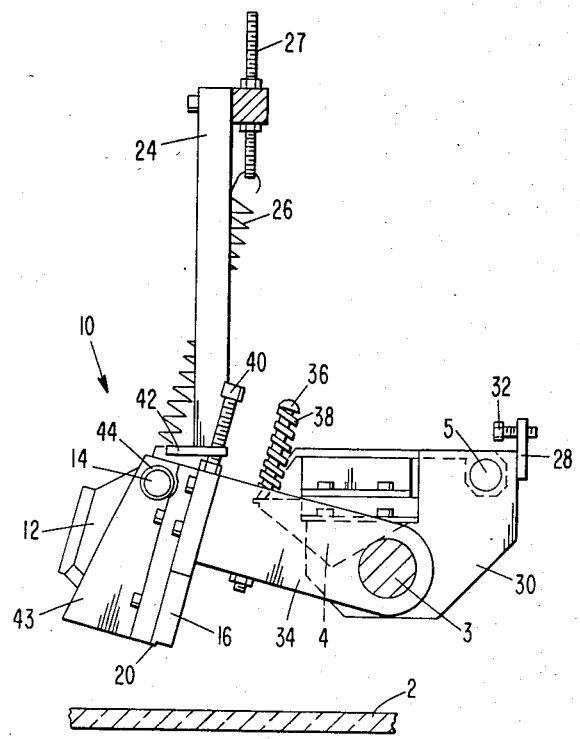
FIGS. 7A–7E are side elevation views of a portion of the machine shown in FIGS. 1–6 in different phases of operation.
Figure 7B:
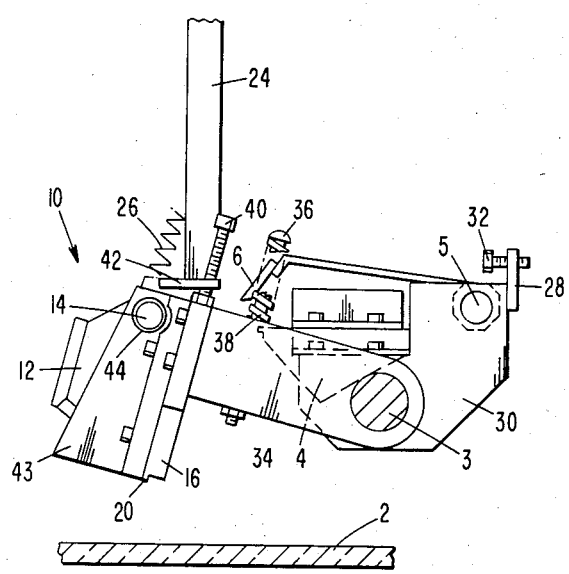
Figure 7C:
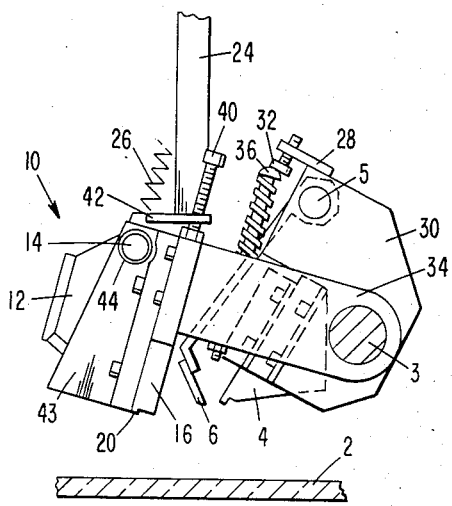
Figure 7D:
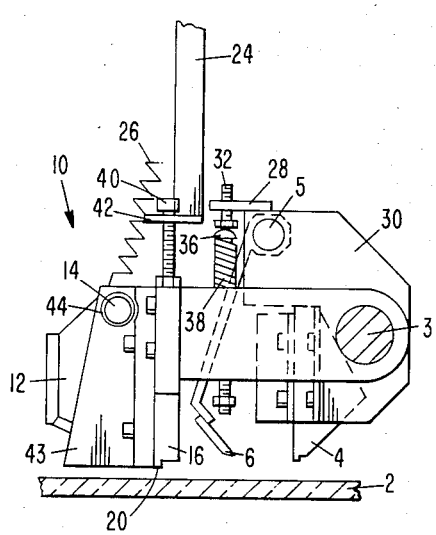
Figure 7E:
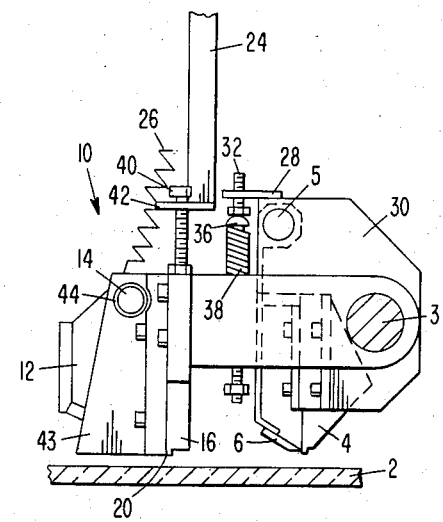

FIGS. 7A–7E show the sequence of operation. FIG. 7A illustrates the various parts in their inactive position. FIG. 7B shows the first stage of operation wherein scoop 6 has been activated. Next, as shown in FIG. 7C, trough 4 is rotated until its abutment members 32 contact pressure pins 36. Trough 4 continues to rotate with arms 34 also rotating under the influence of abutment members 32 so that trough 12 is in the applicating position as shown in FIG. 7D. FIG. 7E shows the position wherein scoop 6 is returned to its closed position.

Various modifications of the present invention are possible without departing from the spirit of the invention. For example, FIG. 1 illustrates the provision of means to minimize vibration which might result from the movement of various parts. As shown therein, an L-shaped bracket 62 is provided which includes a ball detent 64 for resisting vibration or shock from the movements of shaft 14.

It is to be understood that by proper modification of the mechanical elements associated with both troughs, the invention may be practiced by having the first trough upstream from the second trough so that the added trough would apply the second layer of resin. Such reversal in the order of troughs particularly with different type machines might require modifications wherein it is the movement of the upstream trough which causes the downstream trough to be actuated. Accordingly it should be understood that the concepts of this invention are not intended to be limited to the specific preferred embodiment described herein.

A further variation would be to have trough 12 drop under the influence of gravity when trough 4 is actuated and to then have the return movement of trough 4 cause trough 12 to be lifted back to its original position.

What is claimed is:

1. In an automatic plate making machine where liquid photopolymerizable resin is applied to a support for making a printing plate, the improvement being said machine being capable of producing a capped printing plate, including a first trough for applying a resin layer to the support, a second trough for applying a resin layer to the support, actuating means on said first trough for engagement with complementary actuating means on said second trough whereby the actuation of said first trough for applying its resin to the support automatically causes actuation of said second trough for applying its resin to the support, said first trough being movably mounted to said second trough by means of a first mounting unit, said first mounting unit including plate means secured to said first trough, said actuating means being secured to said plate means of said first mounting unit, a second mounting unit, said second trough being secured to said second mounting unit, said complementary actuating means being secured to said second mounting unit, said complementary actuating means being disposed in the path of movement of said actuating means whereby during movement of said first mounting unit said actuating means engages said complementary actuating means to cause said second trough to be positioned and to open, said second trough having a dispensing opening formed between a back wall and a bottom wall of said second trough, said bottom wall being disposed for selective contact against said back wall and selective movement away from said back wall, said actuating means including at least one abutment member on said first mounting unit, said complementary actuating means including at least one pressure pin on said second mounting unit disposed in the path of travel of said abutment member, said second trough being pivotally mounted on a shaft in such a manner that said second trough is rotated downward from its inactive position upon said abutment member contacting and reacting against said pressure pin.

2. In the machine of claim 1 wherein said second mounting unit includes a stop member which is moved during the pivotal movement of said second trough, a stop surface disposed at a fixed location in the path of movement of said stop member to limit the degree of rotation of said second trough and halt its rotation at a predetermined position.

3. In the machine of claim 2 including a lever actuating member secured to said first mounting unit, a lever being secured to said bottom wall of said second trough, and said lever being in the path of movement of said lever actuating member whereby said bottom wall of said second trough is moved away from said back wall of said second trough when said lever actuating member presses against said lever.

4. In the machine of claim 3 wherein said bottom wall of said second trough is a flexible lip, said back wall of said second trough terminating in a doctor blade, and said lip extending below said doctor blade to scoop up excess resin.

5. In the machine of claim 4 including resilient means reacting against said shaft for said second trough for urging said shaft in a direction opposite the direction of rotation of said shaft imparted by said abutment member contacting said pressure pin.

6. In the machine of claim 5 including resilient means mounted on said shaft for said second trough for urging said bottom wall into its closed position.

7. In the machine of claim 6 wherein said first trough has its dispensing opening at its top for dispensing when said first trough is tilted, said first trough being mounted downstream from said second trough, and a rotatable scoop being secured to said first mounting unit for picking up excess resin from said first trough.

8. In the machine of claim 7 including means connecting said scoop to said lever actuating member whereby actuation of said scoop to its open and closed positions results in simultaneous opening and closing of said second trough.

9. In the machine of claim 1 including a lever actuating member secured to said first mounting unit, a lever being secured to said bottom wall of said second trough, and said lever being in the path of movement of said lever actuating member whereby said bottom wall of said second trough is moved away from said back wall of said second trough when said lever actuating member presses against said lever.

10. In the machine of claim 9 wherein said bottom wall of said second trough is a flexible lip, said back wall of said second trough terminating in a doctor blade, and said lip extending below said doctor blade to scoop up excess resin.

11. In the machine of claim 10 including resilient means reacting against said shaft for said second trough for urging said shaft in a direction opposite the direction of rotation of said shaft imparted by said abutment member contacting said pressure pin.

12. In the machine of claim 11 including resilient means mounted on said shaft for said second trough for urging said bottom wall into its closed position.

13. In the machine of claim 12 wherein said first trough has its dispensing opening at its top for dispensing when said first trough is tilted, said first trough being mounted downstream from said second trough, and a rotatable scoop being secured to said first mounting unit for picking up excess resin from said first trough.

14. In the machine of claim 11 including means connecting said scoop to said lever actuating member whereby actuation of said scoop to its open and closed positions results in simultaneous opening and closing of said second trough.

* * * * *